(12) United States Patent
Biloiu et al.

(10) Patent No.: US 7,999,479 B2
(45) Date of Patent: Aug. 16, 2011

(54) CONJUGATED ICP AND ECR PLASMA SOURCES FOR WIDE RIBBON ION BEAM GENERATION AND CONTROL

(75) Inventors: Costel Biloiu, Rockport, MA (US); Jay Scheuer, Rowley, MA (US); Alexander Perel, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 370 days.

(21) Appl. No.: 12/424,964

(22) Filed: Apr. 16, 2009

(65) Prior Publication Data

US 2010/0264328 A1 Oct. 21, 2010

(51) Int. Cl.
*H01J 7/24* (2006.01)
*H05H 1/24* (2006.01)
(52) U.S. Cl. .......... 315/111.51; 315/111.21; 315/111.81
(58) Field of Classification Search .............. 315/111.51, 315/111.21; 313/231.5
See application file for complete search history.

(56) References Cited

U.S. PATENT DOCUMENTS

| | | | |
|---|---|---|---|
| 6,010,755 A | 1/2000 | Suzuki | |
| 6,225,745 B1 * | 5/2001 | Srivastava | 315/111.51 |
| 6,332,947 B1 | 12/2001 | Ichimura et al. | |
| 6,863,021 B2 * | 3/2005 | Sneh | 118/723 ME |
| 2003/0015965 A1 | 1/2003 | Godyak | |
| 2010/0055345 A1 * | 3/2010 | Biloiu et al. | 427/569 |

* cited by examiner

*Primary Examiner* — Nikita Wells
*Assistant Examiner* — Johnnie Smith

(57) ABSTRACT

An ion source, capable of generating high-density wide ribbon ion beam, utilizing one or more plasma sources is disclosed. In addition to the plasma source(s), the ion source also includes a diffusion chamber. The diffusion chamber has an extraction aperture oriented along the same axis as the dielectric cylinder of the plasma source. In one embodiment, dual plasma sources, located on opposing ends of the diffusion chamber are used to create a more uniform extracted ion beam. In a further embodiment, a multicusp magnetic field is used to further improve the uniformity of the extracted ion beam.

17 Claims, 18 Drawing Sheets

CONJUGATED ICP AND ECR PLASMA SOURCES FOR WIDE RIBBON ION BEAM GENERATION AND CONTROL

BACKGROUND OF THE INVENTION

Ion implanters are commonly used in the production of integrated circuits (IC) to create in a semiconductor wafer, usually silicon, regions of different conductivity by p- or n-type doping. In such devices, a plasma source is used to ionize the dopant gas. A beam of positive ions is extracted from the source, accelerated to the desired energy, mass filtered and then directed toward the wafer. As the ions strike the wafer, they penetrate to a certain depth (depending on their kinetic energy and mass) and create regions of different electrical conductivity (depending on the dopant element concentration) into the wafer. The n- or p-doping nature of these regions, along with their geometrical configuration on the wafer, define their functionality, e.g., n-p-n or p-n-p junctions within the transistors. Through interconnection of many such doped regions, the wafers can be transformed into complex integrated circuits.

A block diagram of a representative ion implanter 50 is shown in FIG. 1. Power supply 1 delivers the required energy (DC or RF) to the plasma source 2 to enable ionization of the doping gas. The gas is fed into the plasma chamber through a mass-flow controlled system (not shown) under the pressure in the mTorr range, ensured by a vacuum pumping system. Depending on the desired dopant, different fluoride or hydride doping gases, such $BF_3$, $PF_3$, $AsF_3$, $GeF_4$, $B_2H_6$, $PH_3$, $AsH_3$, $GeH_4$ or others, with or without co-carrier gas, are introduced. The plasma chamber has an aperture 3 through which the ions are extracted by a combination of electrodes 4. A commonly used scheme is a triode combination in which the plasma chamber aperture is at high positive potential, then a second electrode (suppression electrode) at negative potential and finally a third electrode at ground potential. The role of second electrode is to prevent secondary electrons from streaming back to the plasma chamber. However, other extraction electrode combinations such as thetrode, pentode or Einzel lenses are also possible. These exiting ions are formed into a beam 20, which then passes through a mass analyzer magnet 6. The extracted ion beam is composed of a mixture of ions. For instance, the beam extracted from $BF_3$ gas will be comprised mainly of $BF_3^+$, $BF_2^+$, $BF^+$, $B^+$, and $F^+$ ions. Therefore, it is necessary to use the mass analyzer to remove unwanted components from the ion beam, resulting in an ion beam having the desired energy and composed of a single ionic specie (in the case of $BF_3$, the $B^+$ ion). To reduce the energy to the desired level, ions of the desired species then pass through a deceleration stage 8, which may include one or more electrodes. The output of the deceleration stage is a diverging ion beam. A corrector magnet 10 is used to expand the ion beam and then transform it into a parallel ribbon ion beam. Following the angle corrector 10, the ribbon beam is targeted toward the wafer or workpiece. In some embodiments, a second deceleration stage 12 may be added. The wafer or workpiece is attached to a wafer support 14. The wafer support 14 provides a vertical motion so that the wafer can be brought in the beam path and then passed up and down through the fixed ion ribbon beam. It also can be rotated so that implants can be performed at different incidence angles with respect the wafer surface. With the wafer out of the beam path, the beam current can be measured by a Faraday cup 16. Based on the beam current value and the desired dose, the wafer exposure time or the scanning speed and the number of passes through the ribbon ion beam is calculated.

Taking into account that the rate of ion extraction from the plasma source is given by $$dN_{ext}/dt \approx Anv_B$$

where A is the area of the extraction aperture, n the ion density (supposedly equal to electron density), and $v_B=(k_BT_e/m_i)^{1/2}$ the Bohm velocity (with $k_B$, $T_e$ and $m_i$ the Boltzmann constant, electron temperature and ion mass, respectively) a limited number of plasma sources have proved to have sufficient plasma density to be useful as ion sources. In some embodiments, such as Bernas sources, an arc discharge creates the plasma. Tungsten filaments are used to generate a flux of electrons needed to sustain the high arc plasma density. In other embodiments, such as indirectly heated cathodes (IHC) which are also a form of arc discharge, to prevent the filament from detrimental exposure to the plasma and therefore to extend the lifetime of the source, the necessary electrons are provided by thermionic emission from an indirectly heated cathode. While these quasithermal plasma sources are effective in generating the desired ion densities, they are typically only used to create atomic ions, due to the high temperatures developed within the arc chamber. Because dissociation energies are typically low, the thermal energy in the arc plasma is often high enough to breakdown molecular bonds and to fractionate the feeding gas into smaller molecules or atoms.

It has been found that for shallow implants applications where low ion energy is required, in order to overcome the detrimental space-charge effects and to increase the productivity of the ion implantation process, molecular gases with higher content of the active dopant in the molecule such as $C_2B_{10}H_{12}$, $B_{10}H_{14}$, and $B_{18}H_{22}$ can be used. The resulting molecular ions can be accelerated at higher energies, thus preventing the beam from the space-charge detrimental effects. However, due to their heavier mass, shallow implants can be performed.

For such implantation processes that require molecular ions rich in active dopant rather than dopant atomic ions, low temperature plasma sources such as RF inductively coupled discharges are well suited. In these discharges, the plasma is produced by coupling the power from an RF generator through an antenna. One such source is an inductively coupled plasma source (ICP). The high RF currents flowing through the antenna give rise to an oscillatory magnetic field which, according to the Maxwell's $3^{rd}$ electrodynamics law:

$$\nabla \times \vec{E} = -\partial \vec{B}/\partial t$$

produces intense electric fields in a limited spatial region (skin depth) which is a function of the RF excitation frequency and gas pressure. Electrons accelerated by these electric fields gain enough energy to ionize the gas molecules and create a plasma. The created plasma is not in thermal equilibrium since electrons have a temperature (usually ~2-7 eV) much higher than ion or neutral temperature.

Another potential plasma source for ion implantation purposes is an electron cyclotron resonance (ECR) source. The working principle of ECR source utilizes the electron cyclotron resonance to heat the plasma. Microwaves are injected into a volume, at the frequency corresponding to the electron cyclotron resonance as defined below. The volume may contain a low pressure gas. The microwaves may heat free electrons in the gas which in turn collide with the atoms or molecules of the gas in the volume and cause ionization.

In a cold plasma, a wave propagating along the magnetic field obeys the following dispersion relation $$N = \sqrt{1 \pm \left(\frac{f_{pe}}{f}\right)^2 \frac{1}{\frac{f_{ce}}{f}\frac{k_{\|}}{k} \mp 1}}$$

where N is the refraction index, $f_{pe}=(n_e e^2/4\pi^2\epsilon_0 m_e)^{1/2}$ is the plasma frequency (with $n_e$, e, $\epsilon_0$, and $m_e$ the electron density, elementary charge, dielectric constant of the vacuum, and electron mass, respectively), $f_{ce}=eB/2\pi m_e$ is the electron cyclotron frequency (B is the induction of the magnetic field), k and k‖ are the total and parallel with the magnetic field wave numbers. The equation that implies "+" sign before the fraction corresponds to the right hand polarized wave and the other ("−" sign) to the left hand polarized wave. Relevant to ECR sources are the right hand polarized (RHP) waves because they may propagate for arbitrarily high plasma densities for magnetic field strengths for which the cutoff is absent. More important, RHP waves have a resonance at the electron cyclotron frequency which means the plasma can efficiently be heated by coupling the power to the electronic component. For the most common microwave frequency (2.45 GHz), the resonance condition is met when the magnetic field strength is B=875 Gauss.

Due to its simple design (helical antennae for ICP sources, ring magnets for ECR sources) cylindrical geometry was adopted for such plasma sources. The drawback for this geometry is that the plasma is radially non-uniform, i.e., the plasma column has a very peaked density profile on the axis of the discharge. This non-uniform plasma density profile along radial direction characteristic limits the application of this geometry for large area plasma processing. Therefore, typically a processing (diffusion or expansion) chamber may be used in conjunction with the source so that the plasma generated in the plasma source expands within the processing chamber and the peaked density profile relaxes. However, although smoother, for some applications, the density profile is unacceptable because it still tracks the plasma density profile in the source, as seen in FIG. 2.

Therefore, an ion source that can effectively utilize the relatively high plasma density produced by the ICP and/or ECR plasma sources and create a wide and uniform ribbon ion beam would be beneficial from ion implantation perspective.

SUMMARY OF THE INVENTION

The problems of the prior art are addressed by the present disclosure, which describes an ion source, capable of generating a wide ribbon ion beam, which utilizes one or two ICP or ECR plasma sources. In addition to the plasma source(s), the ion source also includes a diffusion chamber. The diffusion chamber, which is a metal cylinder, has an extraction aperture oriented along the central axis of the cylinder. In this way, the peaked radial density profile associated with the cylindrical symmetry of the plasma source is not relevant.

In one embodiment, dual ICP or ECR plasma sources, located on opposing ends of a diffusion chamber are used to create a uniform plasma density along the axial direction in the diffusion chamber and consequently a uniform extracted ribbon ion beam.

In a further embodiment, a multicusp magnetic field surrounding the diffusion chamber is used to further improve the uniformity of the extracted ion beam.

Beam uniformity can also be controlled by means of several independent controls, including gas flow rate, input RF or microwave power, driving frequency, and for ECR sources, the shape of the axial magnetic field profile for each plasma source.

BRIEF DESCRIPTION OF THE DRAWINGS

FIG. 4b shows the magnetic field profile associated with the ECR source presented in FIG. 4a;

DETAILED DESCRIPTION OF THE INVENTION

Figure 3:
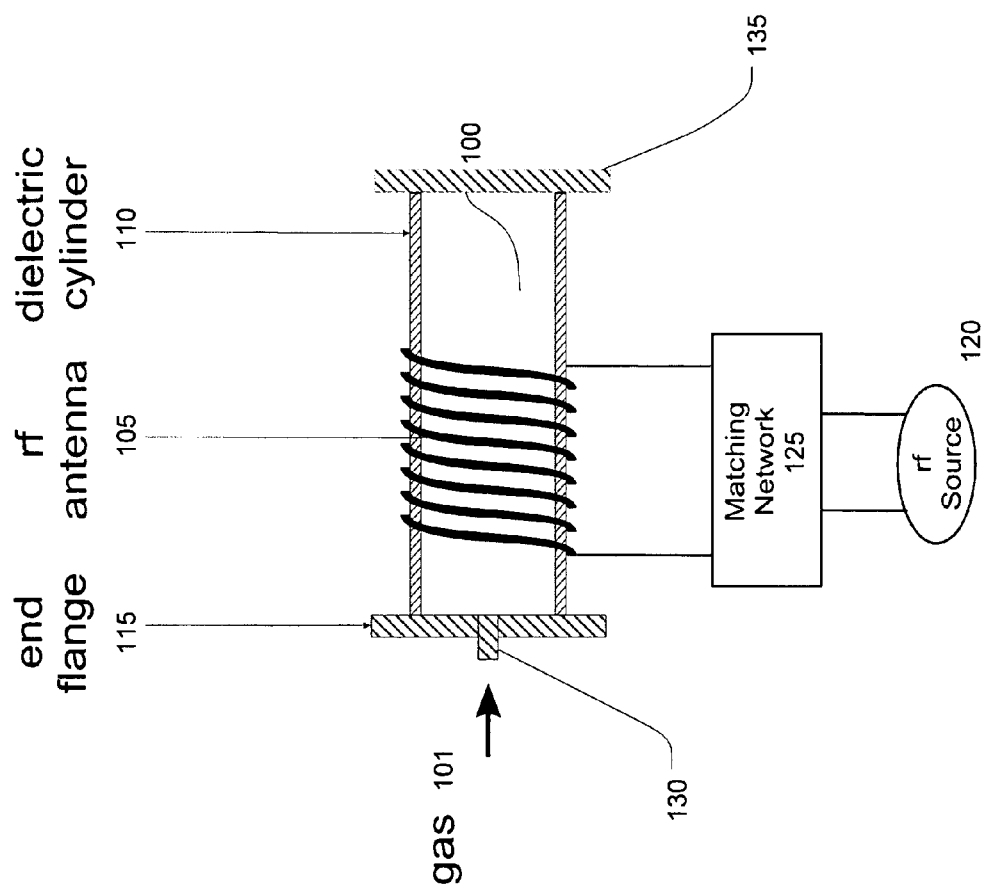
FIG. 3 shows the major components of a conventional ICP plasma source.

FIG. 3 shows, in a longitudinal cross-section, the main components of a typical ICP plasma source 100. A dielectric cylinder 110 is preferably used to contain the low pressure gas and to allow RF coupling from the antenna 105 to the plasma. For proper functioning, the gas pressure within the cylinder is preferably maintained at less than 20 mTorr. The dielectric cylinder 110 can be comprised of any suitable dielectric material, such as quartz, pyrex, alumina or sapphire. Tightly wrapped around the dielectric cylinder is a helical antenna 105, used to couple the RF power to the electronic component of the plasma. The antenna 105, preferably made of copper tubing to allow cooling, is powered by an RF power supply 120. The RF matching to the variable plasma impedance can be accomplished by an automatic L- or PI-type matching network 125. In other embodiments, the antenna 105 can be embedded in the wall of the dielectric cylinder. The energy transferred by the antenna is used to ionize the gas within the dielectric cylinder. One end of the ICP source is terminated by a flange 115 that preferably contains the gas inlet 130 through which the desired working gas 101 is introduced into the chamber at a certain flow rate. The opposite end is open and preferably has an elastic coupling 135 for connection of the dielectric cylinder 110 to a metallic diffusion chamber (not shown).

Figure 4A:
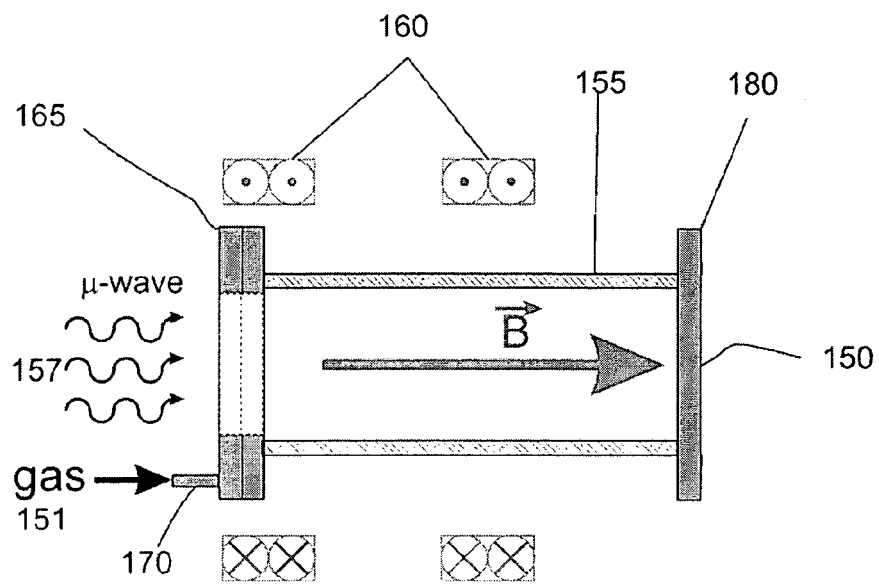
FIG. 4a shows the major components of a conventional ECR plasma source.

FIG. 4a shows, in a longitudinal cross-section, the main components of a typical ECR plasma source 150. A cylinder 155 is preferably used to contain the low pressure gas. For proper functioning, the gas pressure within the cylinder 155 made of non-magnetic material is preferably maintained at less than 20 mTorr. To create the electron-cyclotron resonance zone, the necessary magnetic field is provided by a magnet 160, most preferably a solenoid or multiple axially symmetric solenoids, capable of providing an axial magnetic field in excess of 1 kGauss. This will allow running the ECR source at the typical 2.45 GHz microwave frequency. However, running at other RF frequencies is also possible. Higher values of the magnetic field strength can be provided by a stack of Sm—Co or Nd—Fe—B permanent magnets. Thus, the magnet 160 is understood to represent either one or more solenoids or a permanent magnet configuration throughout this disclosure. One end of the ECR source is terminated by a flange 165 that preferably contains the gas inlet 170 through which the desired working gas 151 is introduced into the chamber at a certain flow rate. This end may include a microwave coupler (which are well known in the art) and a dielectric window 168 through which microwaves 157 may enter the cylinder 155. The dielectric window 155 may be made of materials such as quartz, alumina, or sapphire. These microwaves are at a frequency equal to the electron cyclotron resonance, as defined by the magnetic field value at a certain axial position. The opposite end is open and preferably has an elastic coupling 180 for connection of the cylinder 155 to a metallic diffusion chamber. The solenoid(s) 160 is (are) fed by a DC current supply (not shown). The direction of current flow or the orientation of the permanent magnets is chosen so that the magnetic field induction (B) points towards the open end of the cylinder 210 thereby allowing propagation of RHP waves. The $\otimes$ and $\odot$ symbols used in conjunction with the solenoid 160 are used to signify the fact that the current enters and respectively exits the plane of the paper.

Figure 4B:
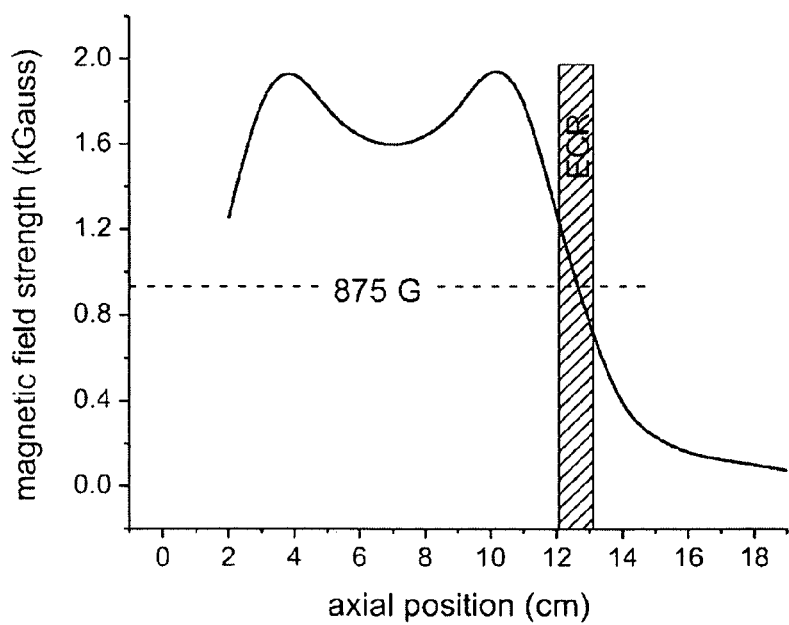

The magnetic cylinder's relative axial positions may be precisely tailored so that the desirably electron cyclotron resonance zone will be spatially located at the open end of the source as shown by the hatched zone in FIG. 4b. Since microwave propagation requires magnetic field strength values higher that the electron-cyclotron resonance value, the geometry supposes larger field strengths upstream the resonance zone, i.e., from the dielectric window toward the open end of the source. Failure to do so may result in damping of the waves before they reach the resonance zone.

Figure 1:
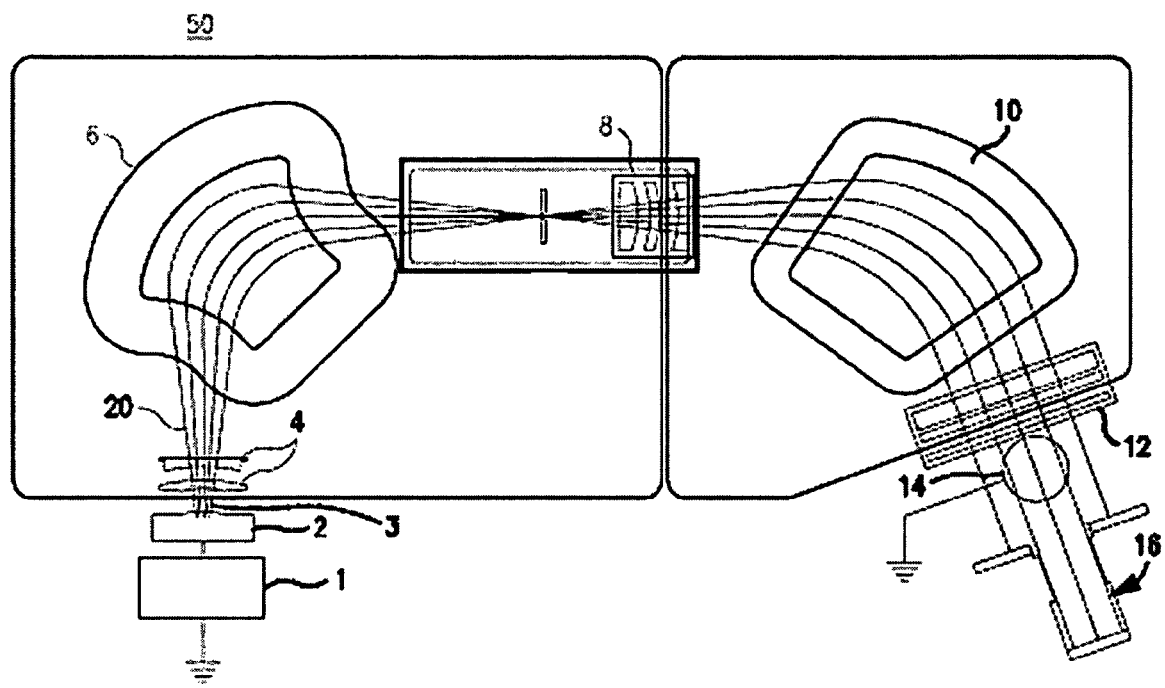
FIG. 1 illustrates a block diagram of a representative high-current ion implanter tool.
Figure 2:
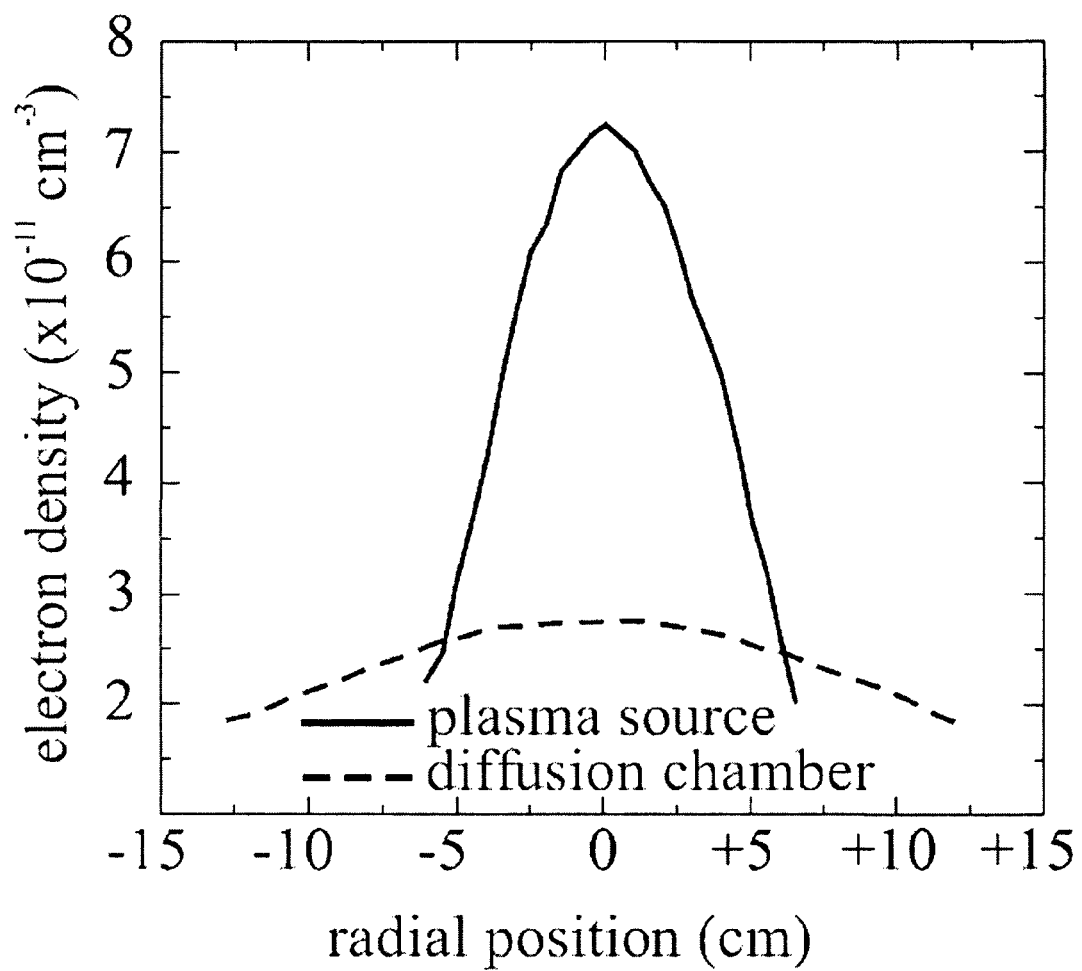
FIG. 2 illustrates the radial plasma density profile in the source and in the diffusion chamber for a cylindrical symmetric plasma source.

The plasma sources described above typically produce a plasma having a radial density profile that peaks along the central axis of cylinder 110,155. Even when used in conjunction with a diffusion chamber, although more or less flattened, the density profile in the diffusion chamber still exhibits the same non-uniform radial profile as shown in FIG. 2. Thus, extraction of the ion beam through a slit oriented along an axis orthogonal to the central axis of the cylinder 110,155, results in a peaked ribbon ion beam profile, having a high current density in the central part and lower beam current density at the periphery of the beam. This characteristic is unacceptable for implantation purposes since it will produce a non-uniform implanted dose and consequently a poor final semiconductor device.

Figure 5A:
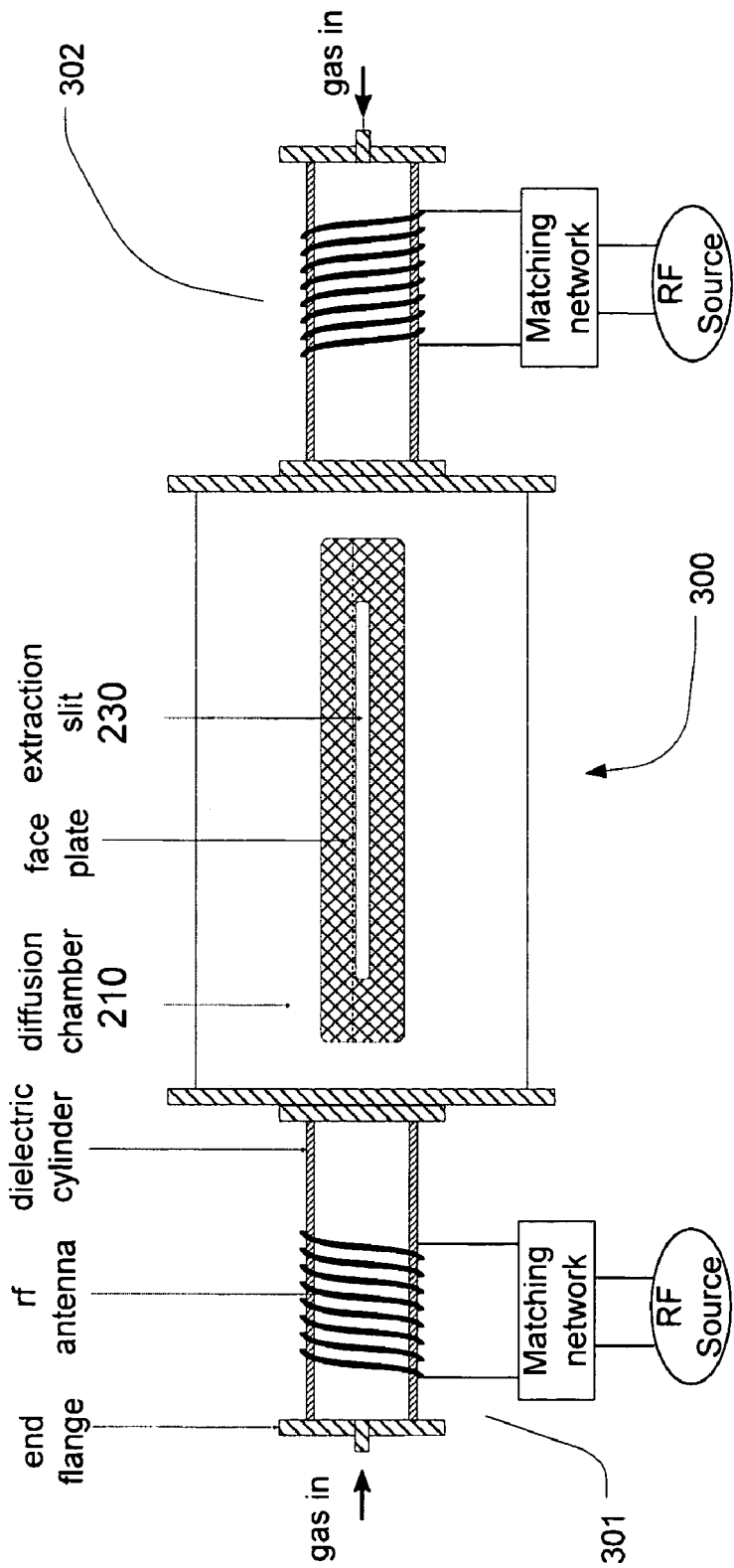
FIG. 5a shows a side view of an embodiment of the dual ICP plasma source.

FIG. 5a illustrates a first embodiment of the ion source 300. Two ICP plasma sources 301, 302 such as those described in conjunction with FIG. 3, are axially mated with a diffusion chamber 210. The diffusion chamber 210 is preferably in the shape of a cylinder, preferably having a diameter greater than that of the dielectric cylinders 301,302 such as 20-50 cm. The ICP sources and the diffusion chamber are aligned such that the central axes are collinear; in other words the three components are coaxial. The extraction aperture 330 is located on the diffusion chamber 210, parallel to the central axis of the chamber. The height of the extraction aperture is preferably small, such as 3-5 mm. The length of the diffusion chamber 210 can be chosen to accommodate ribbon ion beam extraction slit 330 having width of 35 cm, which will allow implantation of 300 mm diameter wafers. Because there are not limiting conditions on the length of the diffusion chamber, a wider extraction aperture of 50 cm that would permit implantation of next generation 450 mm diameter wafers is possible.

Figure 5B:
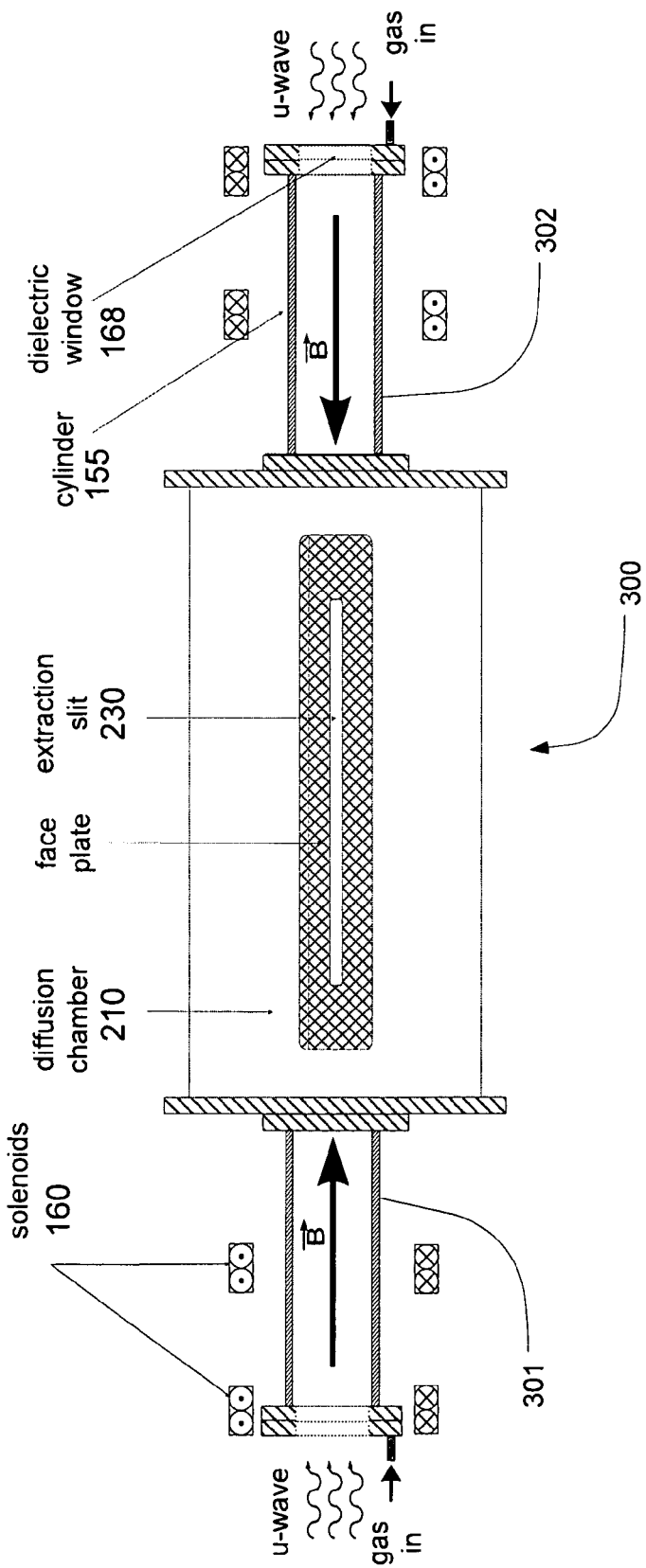
FIG. 5b shows a side view of an embodiment of the dual ECR plasma source.

FIG. 5b illustrates a second embodiment of the plasma ion source 300. Instead of conjugated ICP sources, two ECR plasma sources 301, 302 such as those described in conjunction with FIG. 4, are axially mated with a diffusion chamber 210.

Figure 6A:
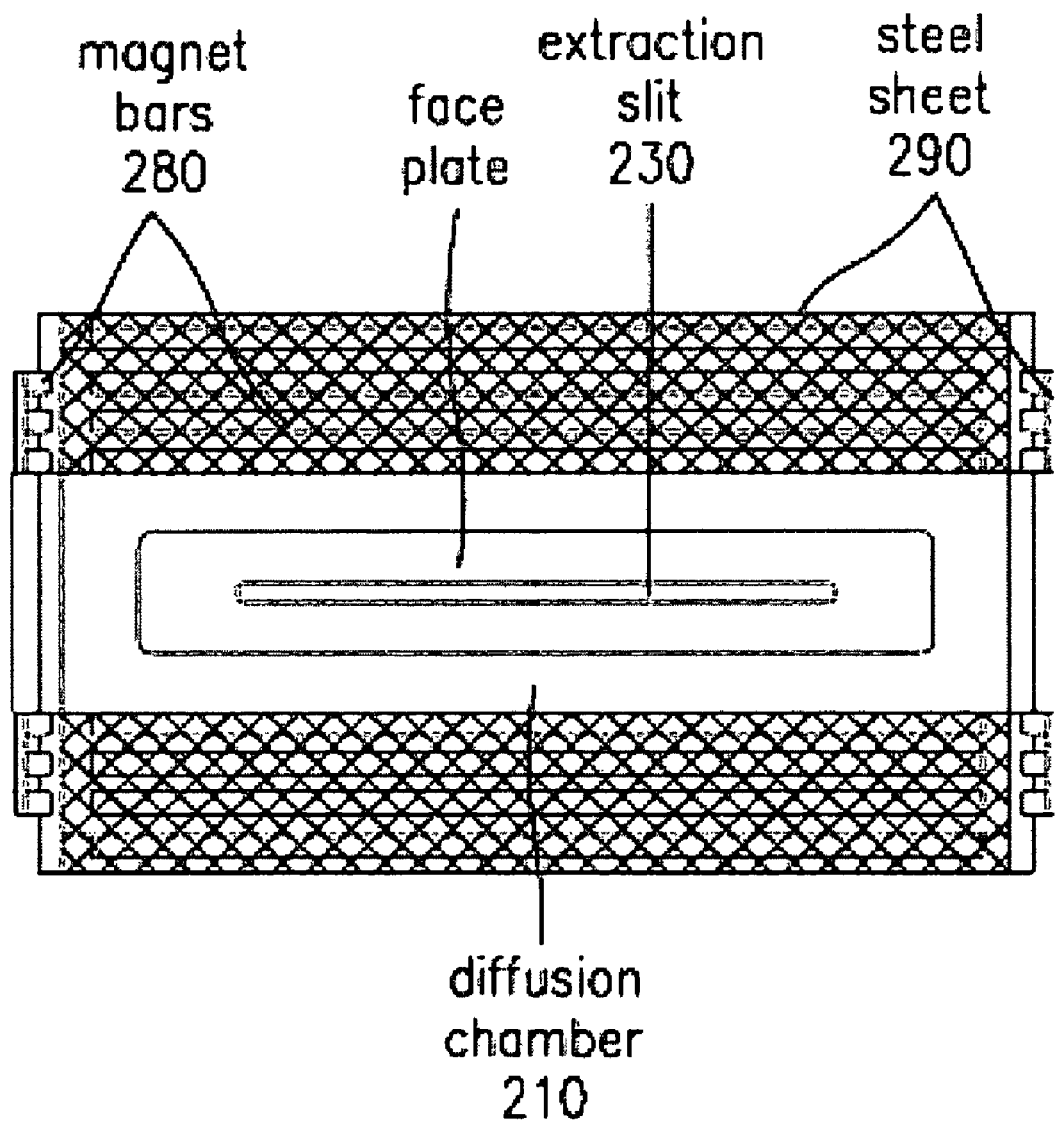
FIG. 6a shows a side view of a first embodiment of the diffusion chamber.
Figure 6B:
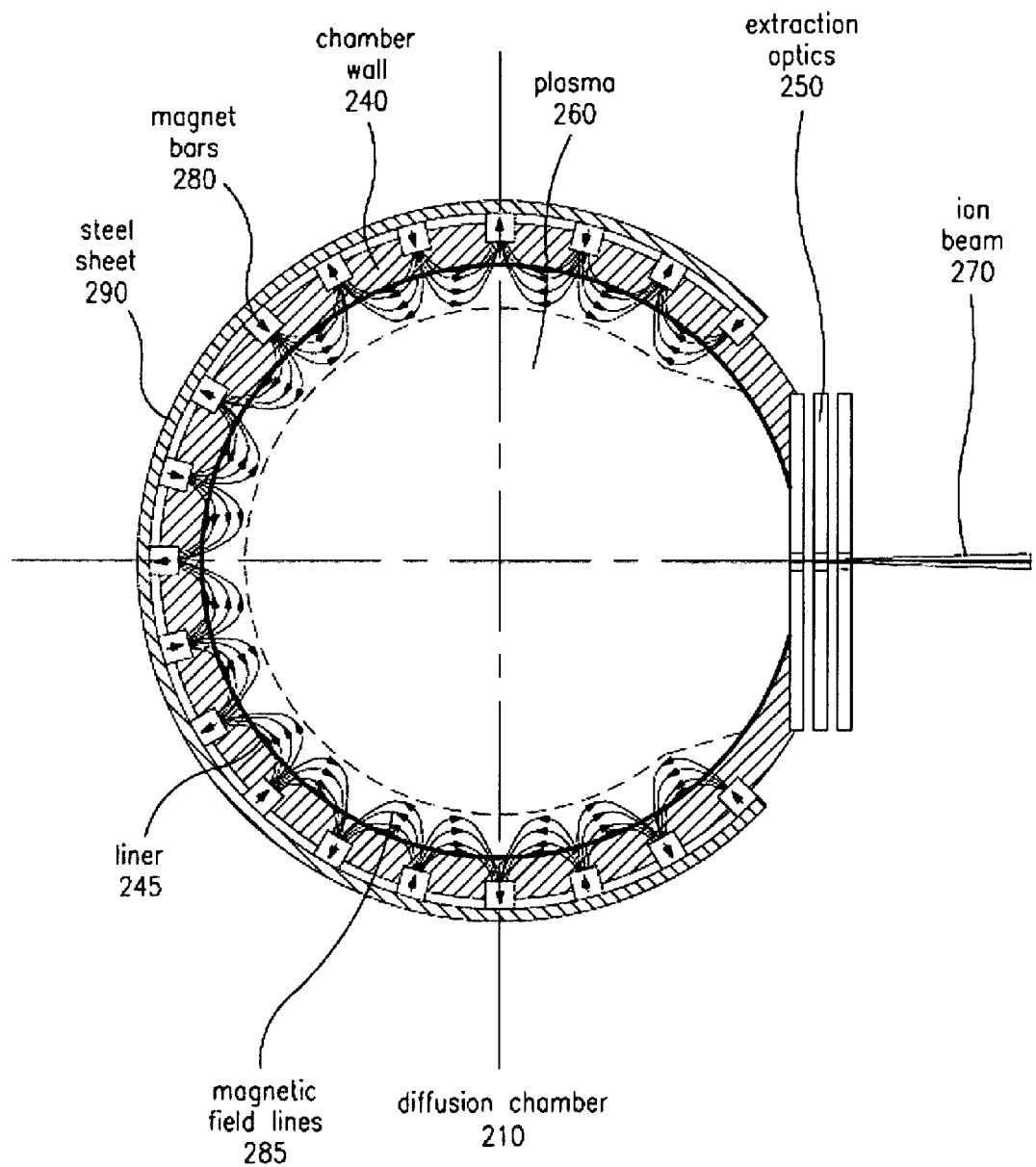
FIG. 6b shows a transversal cross section of the diffusion chamber of FIG. 6a with one extraction aperture.

FIG. 6a shows a side view of a representative diffusion chamber, while FIG. 6b shows a cross-section of a representative diffusion chamber that can be used with the embodiments shown in FIGS. 5a-b. As shown in FIG. 6b, the chamber housing 240 of the diffusion chamber 210 is preferably constructed of aluminum or a similar magnetically permeable material. In certain embodiments, an electrically conductive liner 245 is placed around the inner surface of the chamber housing. This liner 245, which is preferably made of doped silicon carbide or graphite, has two purposes. First, it serves to reduce sputtering and possible contamination of the plasma 260 and resulting ion beam 270 with metals from the chamber wall 240. Second, its electrical conductive nature ensures a control of the plasma potential.

Figure 6C:
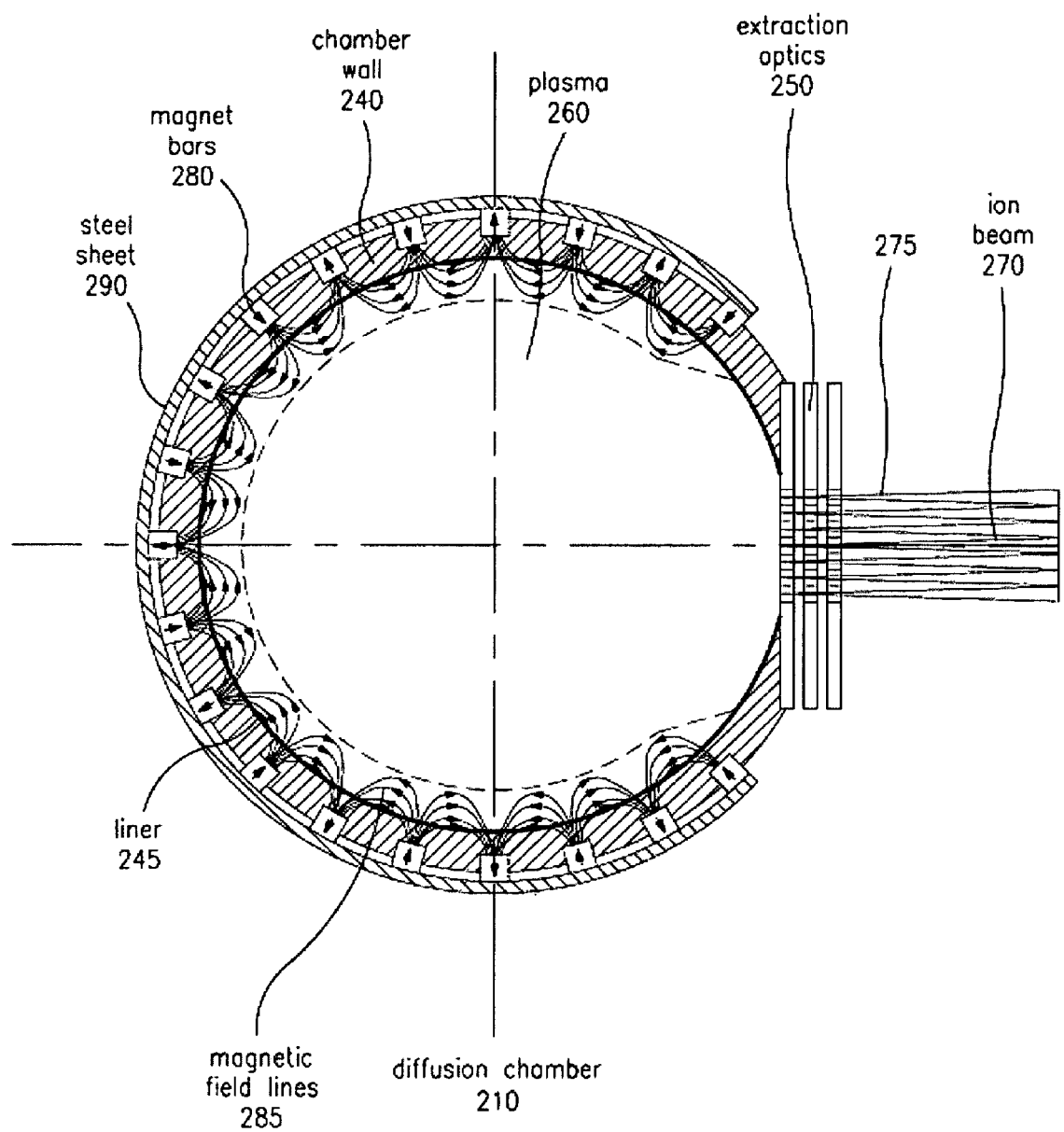
FIG. 6c shows a transversal cross section of the diffusion chamber of FIG. 6a with multiple extraction apertures.
Figure 6D:
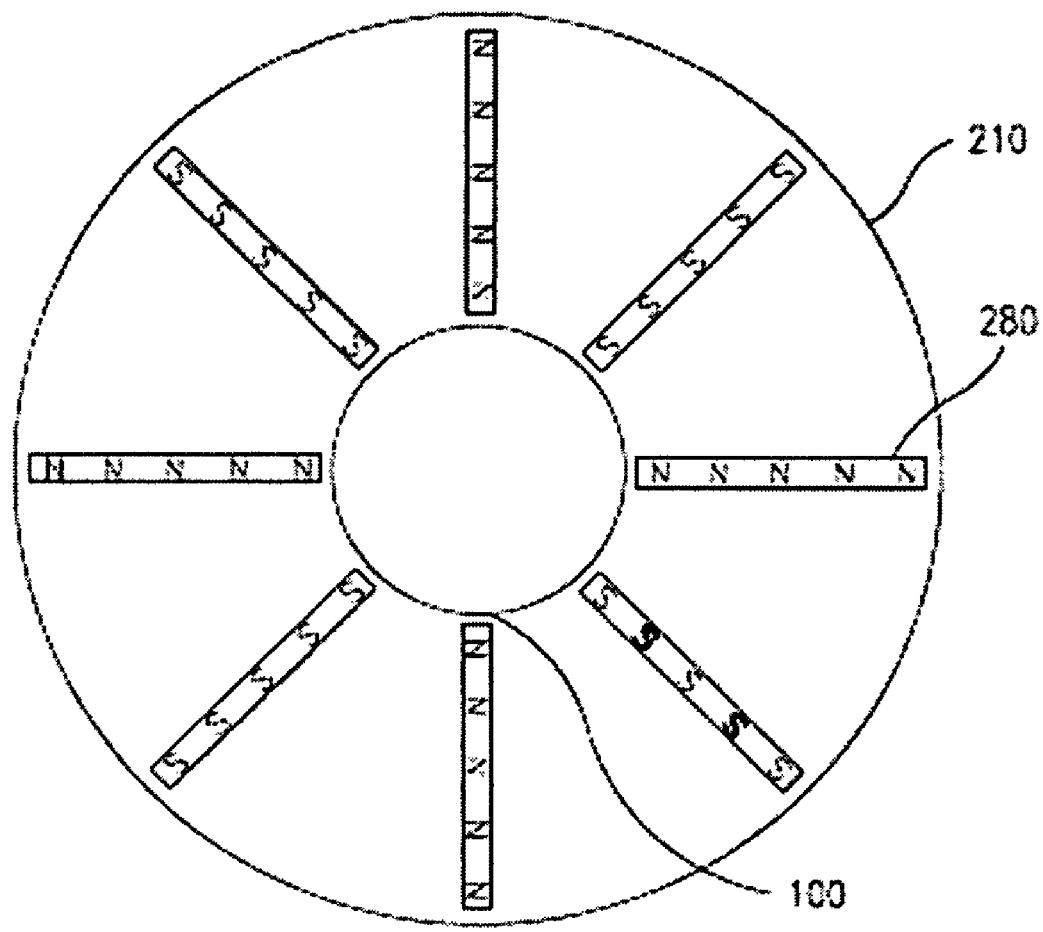
FIG. 6d shows an end view of a first embodiment of the ion source shown in FIGS. 5a-b.

To allow extraction of positive ions, the chamber is electrically biased at positive potential by a high voltage DC power supply (not shown). In one embodiment, shown in FIGS. 6a-b, a single extraction aperture is used to extract the beam with the help of extraction optics 250. Typically, the extraction optics 250 comprises a set of electrodes of various electrical potentials, which serve to extract the positive ions from the plasma 260. FIG. 6b shows a triode extraction optics, but tetrode or pentode assemblies can be used as well. In one embodiment, this aperture is 3 mm in height and 350 mm in length, although other sizes and configurations are possible. In a second embodiment, shown in FIG. 6c, multiple parallel apertures are used allowing for extraction of multiple beamlets 275 that further are composed and result in a taller and higher current ribbon ion beam 270.

As shown in FIG. 6a, to improve the uniformity of the plasma 260, a multicusp magnetic configuration, preferably realized with rows of permanent magnets bars 280, such as Sm—Co or Nb—Fe—B, oriented along the length of the diffusion chamber, may be used. These magnets 280 are mounted such that the poles that face the outer surface of the chamber housing 240 of the diffusion chamber 210 alternate in polarity. In other words, one magnet row is arranged such that the north pole faces the chamber housing 240, while the magnets in the rows that are adjacent on each side of that row are arranged such that their south poles face the chamber housing. This pattern is repeated about the circumference of the chamber housing, except in the regions in close proximity to the extraction aperture 230. To close as many as possible magnetic field lines 285, on the left and right diffusion chamber walls, the multicusp field can be generated by placing the magnets 280 in continuation and with the same polarity of longitudinal rows that will form the radial pattern shown in FIG. 6c. The magnetic field strength B and the penetration depth y of the magnetic field lines 285 in the plasma are controlled by the circumferential separation d of the magnets having alternate polarity, by the magnetic field strength at the magnet surface $B_0$ and by the magnets width $\Delta$, according to the equation:

$$B(y) = \frac{2B_0\Delta}{d}\exp\left(-\frac{\pi y}{d}\right)$$

By a proper adjustment of these parameters, a strong magnetic field can be created near by the chamber wall whereas the bulk plasma is magnetic field free. In this way, the charged particles (electrons and ions) are trapped by the magnetic field lines 285 and thus resulting in lower losses to the chamber walls 240 and implicitly higher plasma density and uniformity. The strength of the magnetic field may be increased by adding a steel sheet 290 that surrounds the magnets and creates the "yoke" effect. In one embodiment for square cross-section shaped Sm—Co magnets having $\Delta=\frac{3}{8}"$, and $d=\frac{3}{4}"$, a magnetic field strength of 50 G at 1.5" from the chamber wall was obtained. For the proposed geometry, the resulting overall multicusp magnetic field causes the plasma 260 to shift toward the extraction aperture 230. By having no magnetic field in the extraction aperture region, the charged particles are free to move toward the extraction aperture 230 and therefore a high density ion beam can be extracted. Shown in FIGS. 6b and 6c by dashed line is the boundary between the bulk, magnetic field free plasma, and the zone where a strong magnetic field exists.

Figure 7A:
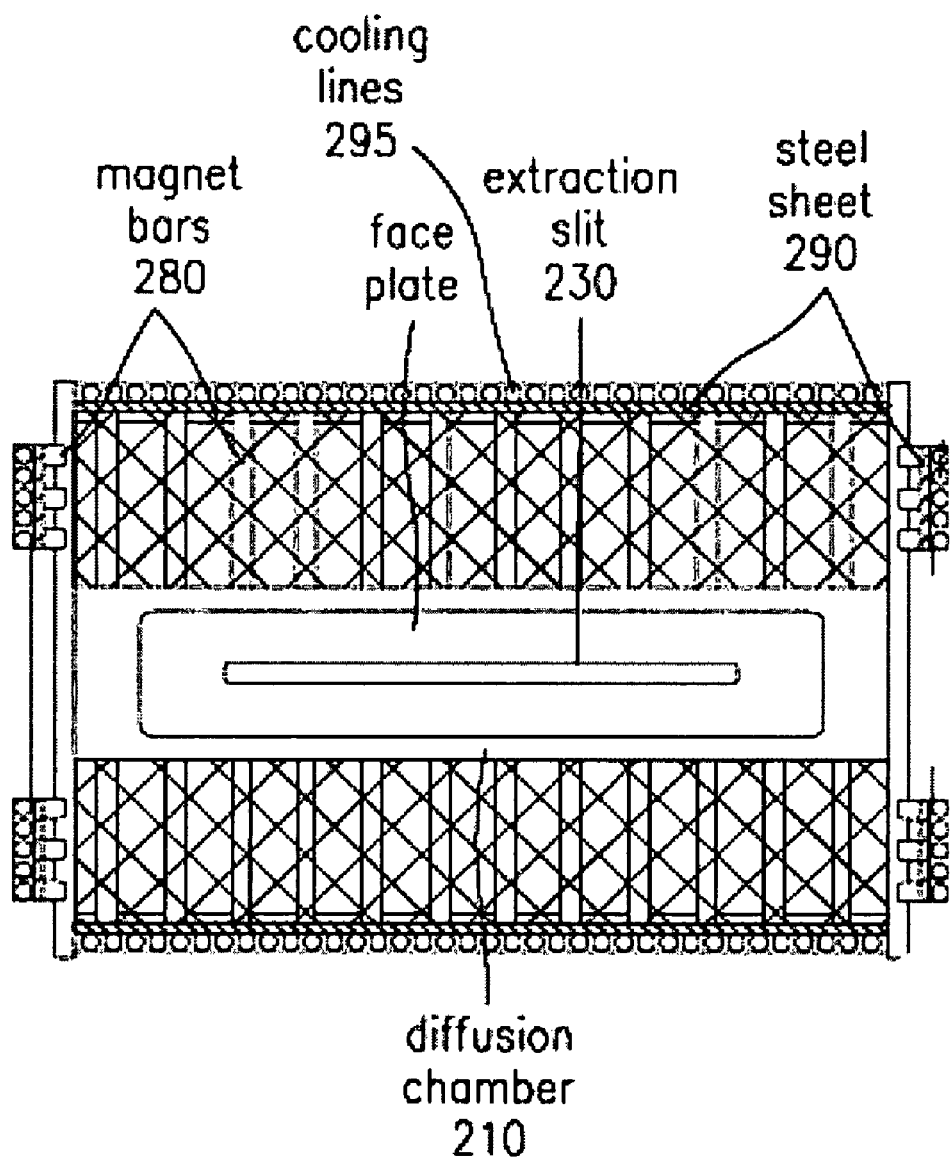
FIG. 7a shows a side view of the second embodiment of the diffusion chamber.
Figure 7B:
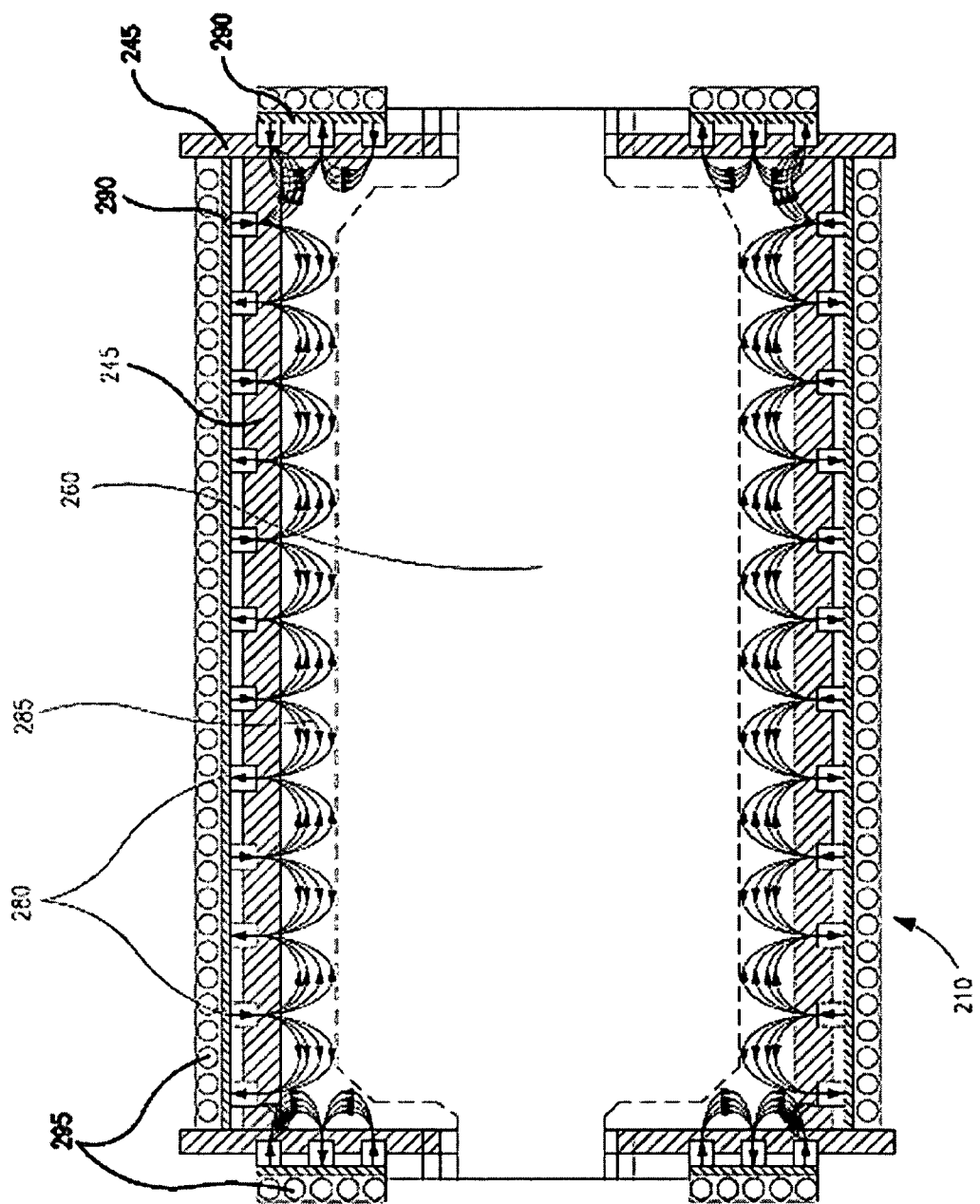
FIG. 7b shows a longitudinal cross section of the diffusion chamber of FIG. 7a in a plane containing the diameter and parallel with the extraction aperture.
Figure 7C:
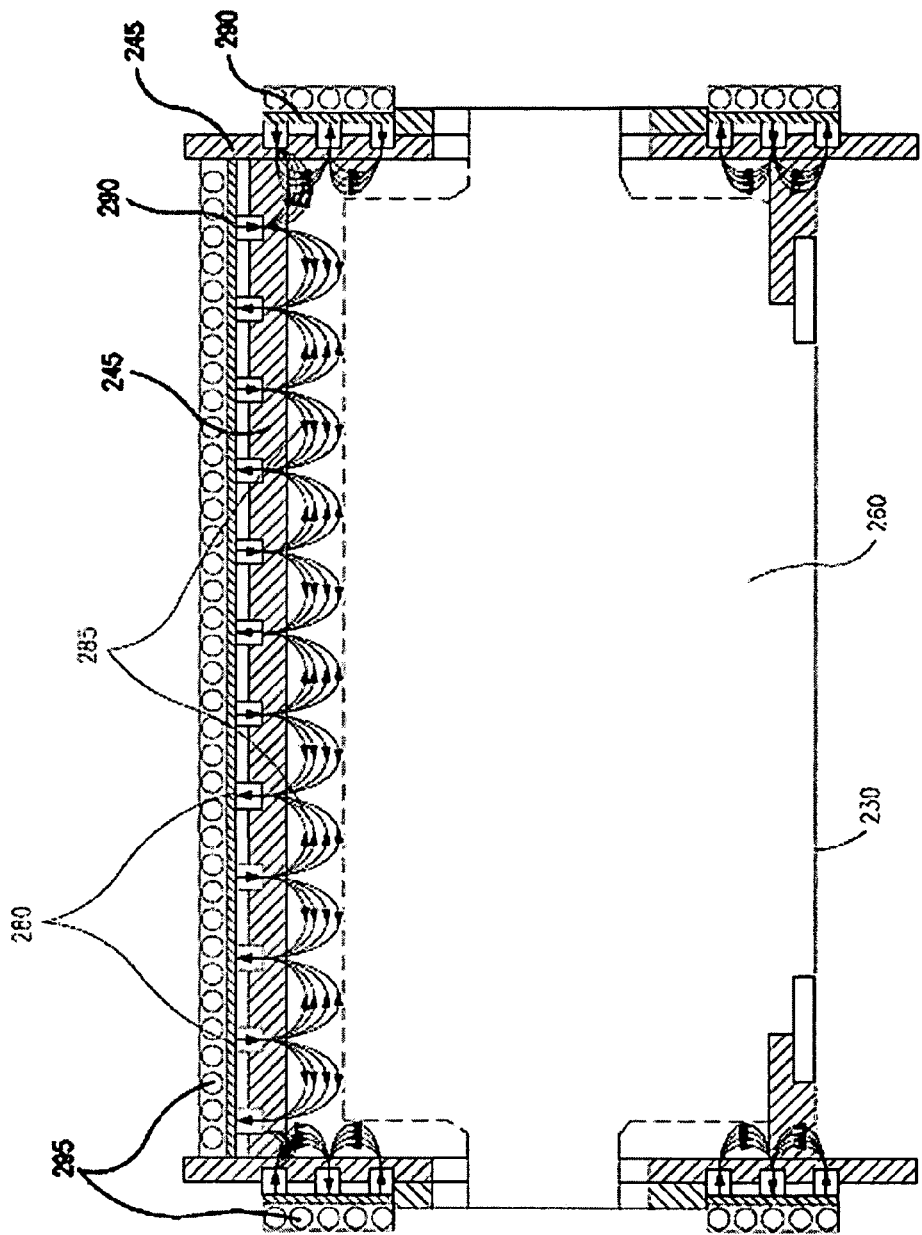
FIG. 7c shows a longitudinal cross section of the diffusion chamber of FIG. 7a in a plane containing the diameter and the extraction aperture.
Figure 7D:
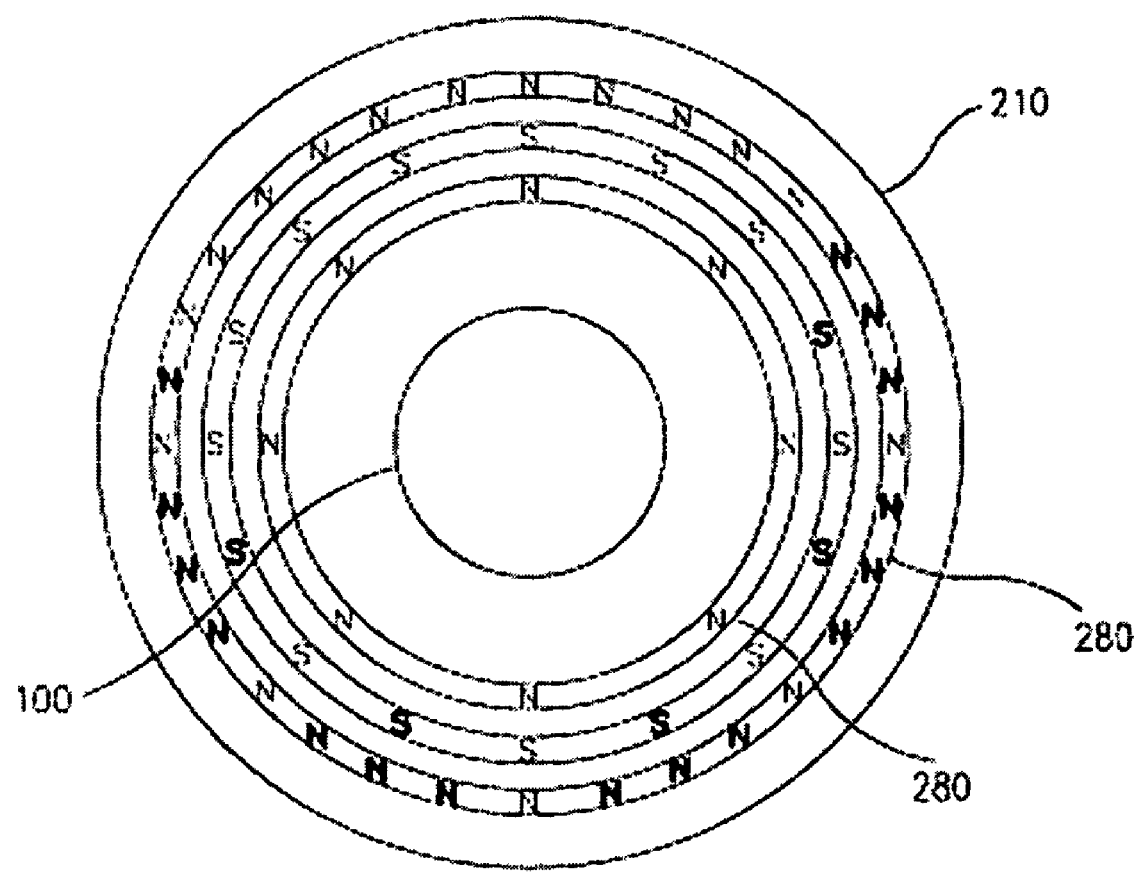
FIG. 7d shows an end view of a second embodiment of the ion source shown in FIGS. 5a-b.

In another embodiment shown in FIGS. 7a-d, the permanent magnet bars 280 generating the multicusp magnetic field 285 are arranged in a circumferential pattern: a row of magnets with the same polarity, e.g., with north pole facing the interior of the chamber is placed along the circumference of the chamber, except the circular sector where the extraction aperture is located. The multicusp magnetic field results from using alternating magnets polarities, i.e., the adjacent circumferential rows separated by longitudinal distance d will have the south pole facing the interior of the chamber and the north pole facing the exterior of the chamber. The pattern is continued on the left and right side walls by placing the magnets with alternate polarities along concentric circles as shown in FIG. 7d. To protect the magnets against the heat developed during operation, a cooling system 295 (shown in FIGS. 7b-c) may be placed around the diffusion chamber. Water can be used as a cooling agent, however other cooling liquids or gases can be used as well.

FIGS. 6 and 7b illustrate two representative configurations used to generate the multicusp magnetic field. For both embodiments, to prevent the beam from undesired magnetic effects, the ion beam extraction region and the bulk plasma is magnetic field free, i.e., the multicusp magnetic field extends over the circumference of the diffusion chamber except the circular sector where the extraction aperture is located. Those skilled in the art will appreciate that other techniques and configurations can be used to achieve this field.

Figure 8A:
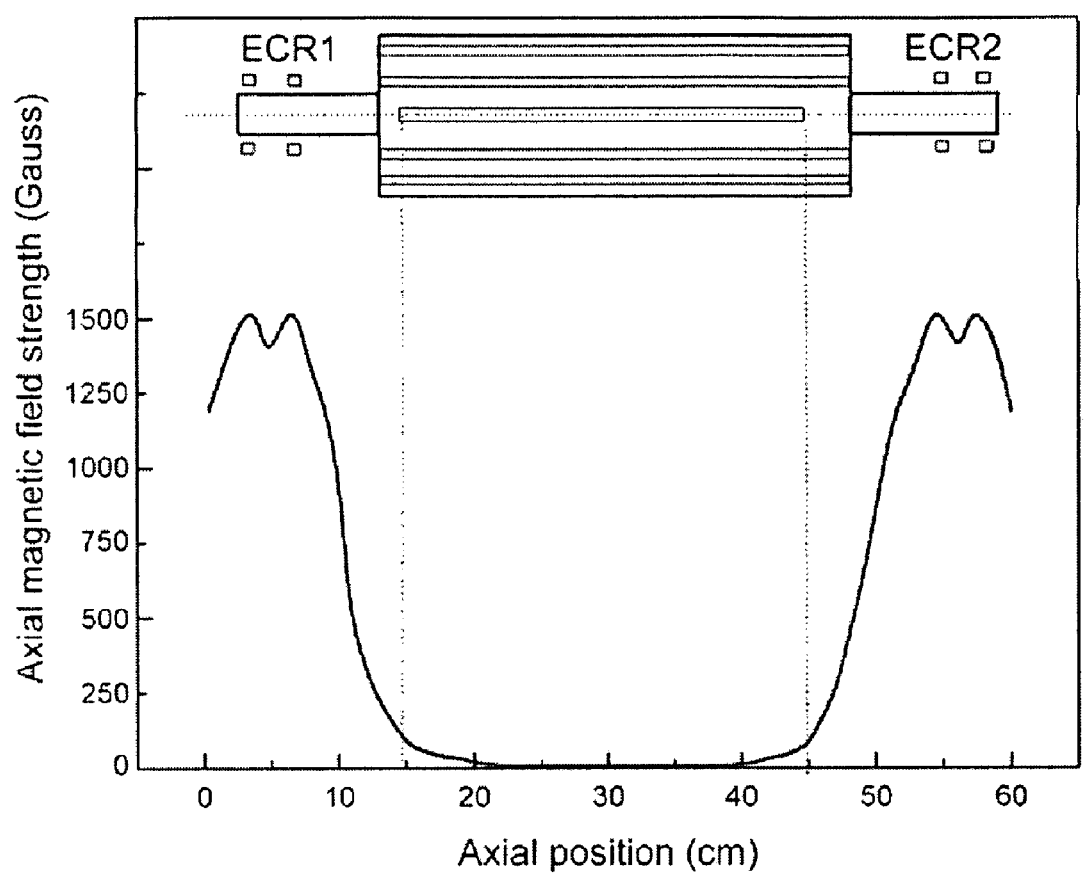
FIG. 8a is a graph showing the distribution of the axial magnetic field induction in the conjugated ECR plasma sources and diffusion chamber

Referring to FIGS. 4a and 4b, the ECR plasma sources 301,302 inject the plasma in a common diffusion chamber. Since the axial magnetic field in each of the ECR plasma sources is in opposite directions, it is essential that the magnetic field generated by each solenoid decrease to sufficiently low values such that ion extraction through the aperture 230 is not perturbed. This can be realized in part by a proper placement of the solenoids against the diffusion chamber and by the left and right diffusion chamber flanges multicusp fields. Since the strength of the local multicusp fields will be relatively high, the weak axial components of the magnetic field generated by the solenoids in the diffusion chamber will be nullified. The resulting axial magnetic field profile shown in FIG. 8a will allow the necessary magnetic field strength to fulfill the ECR condition in each source and, at the same time, create a roughly zero axial magnetic field in the bulk of the diffusion chamber to allow the multicusp field to repel the plasma from the wall but at the same time to "push" it toward the extraction aperture.

Figure 8B:
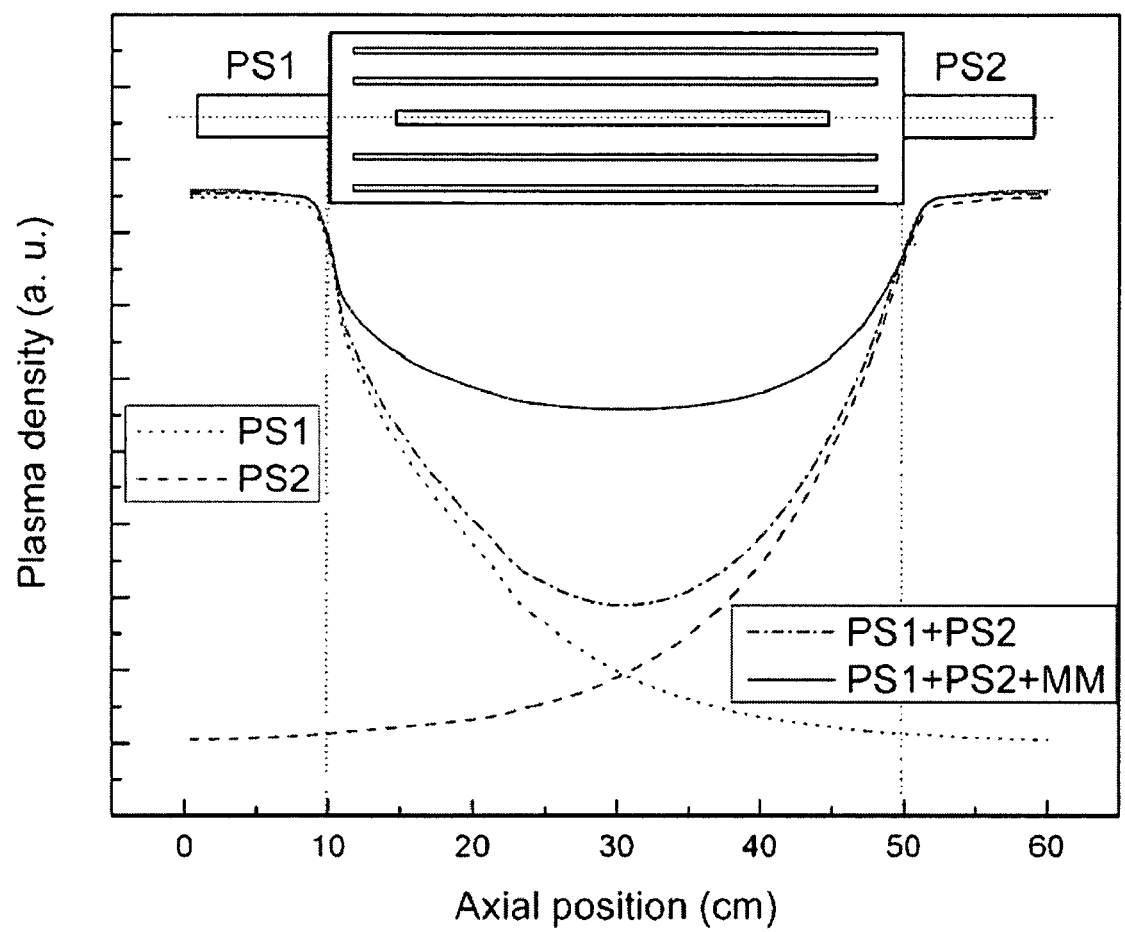
FIG. 8b is a graph showing representative axial plasma densities for various ECR plasma+diffusion chamber configurations.

FIG. 8b illustrates representative graphs showing the plasma density of various configurations. The lines labeled "PS1" and "PS2" show representative relationships of the plasma density as a function of axial position for the case in which only one plasma source (ICP or ECR) injects plasma into the diffusion chamber. Note that the density decreases as the axial distance from the plasma source 100 increases. The line labeled "PS1+PS2" shows a representative graph of the plasma density for the configuration in which both plasma sources are in operation, i.e., pumping plasma in the common diffusion chamber, but the diffusion chamber has no magnetic multicusp field. Note that the densities from the individual plasma sources add together to create a more uniform plasma density along the axial direction of the diffusion chamber. In this way, the decrease in plasma density experienced within the diffusion chamber 210 as the distance from the first source 301 increases is counteracted by the existence of a second plasma source 302. The line labeled "PS1+PS2+MM" shows a representative profile of the plasma density for the configuration in which both plasma sources are working and the magnetic multicusp field is present. The presence of the magnetic multicusp field extends the longitudinal range of the plasma uniformity.

Note that while the preferred embodiment utilizes two plasma sources (either ICP or ECR), the disclosure also contemplates use of a single plasma source coupled with a diffusion chamber. In this embodiment, the non-uniform beam profile resulting from the decrease in plasma density along the longitudinal axis for deeper and deeper positions into the diffusion chamber can be counteracted through other techniques, such as the use of an extraction slit having variable height (progressively increasing in the direction of plasma density decrease) and/or introducing a magnetic field gradient in the multicusp magnetic field configuration in the diffusion chamber.

Both types of ion sources described above allow the resulting plasma density in the diffusion chamber to be varied in a number of ways. For both embodiments, since each plasma source is independently fed with working gas and the vacuum pumping is accomplished through the extraction aperture on the common diffusion chamber, the rate of gas flow into each of the plasma sources can be varied independently. This will result in a fine adjustment of the plasma density profile along longitudinal direction.

Secondly, the multi-cusp magnetic field within the diffusion chamber can be adjusted to improve the uniformity of the plasma density. This can be achieved by choosing adequate values for the surface magnetic field strength, magnet bars dimensions and separation gaps.

In the case of the ICP sources, the power used to drive the RF antennae can be varied independently for each source, thereby introducing another control parameter. Similarly for ECR sources, the injected microwave power can be varied independently.

In the case of the ECR source, an additional method of adjusting the plasma density axial profile and implicitly the beam uniformity is by shaping the magnetic field in each plasma source, either by varying the DC current (in the scenario where solenoids are used) or adjusting the spatial position (in the scenario where permanent magnets are used).

Fine tuning of each of these control knobs will allow extraction of a high ribbon ion beam current with very good uniformity over extended width. This will allow uniform dose implants for large diameter wafers.

As described above, this device can be used for ion implanters. It is expected that uniform ribbon ion beams of several hundred milliamps, having a width greater than 350 and up to 500 millimeters can be generated using this ion source.

Figure 9:
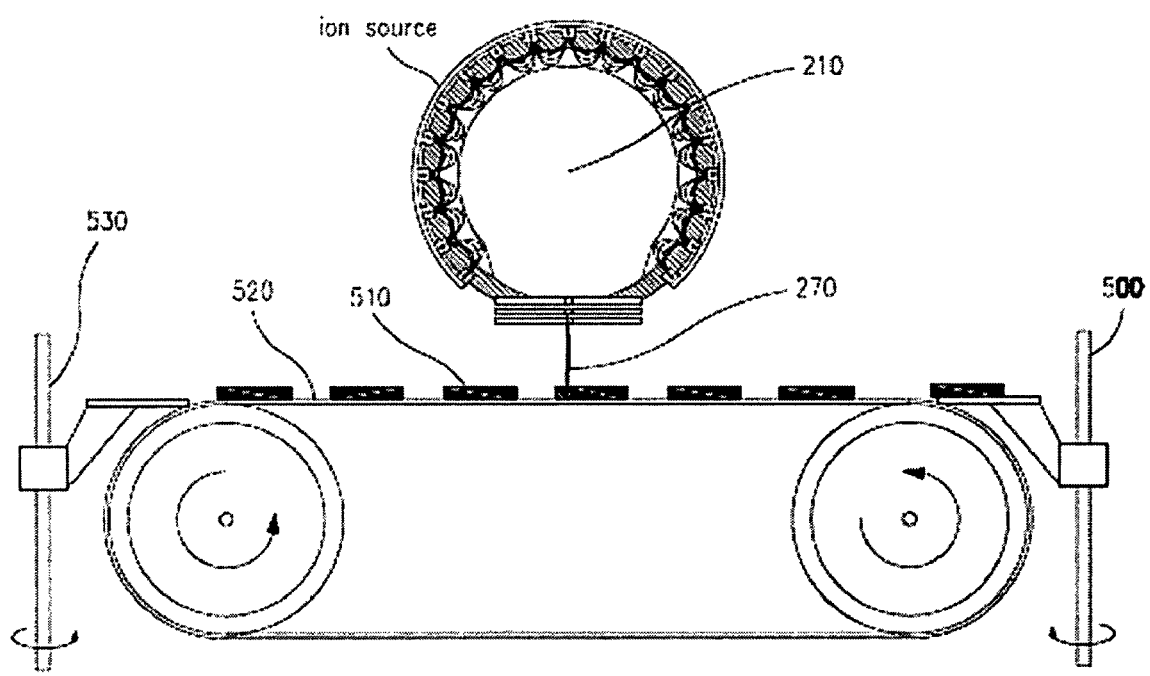
FIG. 9 shows an ion source configuration used for doping solar cell built on silicon wafers.

However, its uses are not limited to only classical ion implantation applications. This device can be used for other applications, for instance in doping on-wafer build solar cells as shown in FIG. 9. Since the expected extracted current is very high, the desired doping can be realized quickly, preferably in a single pass. In such a case, wafers 510 are placed on surface, such as a conveyer belt 520, which brings the wafers 510 under the incidence of the ribbon ion beam 270. In one embodiment, a robotic arm 500 is used to place the wafers 510 on the conveyer belt 520. In this embodiment, the desired dose is set by the beam current and the speed of the conveyer belt 520. After implantation, the wafers 520 are taken off from the belt 510, such as by a second robotic arm 530.

Figure 10:
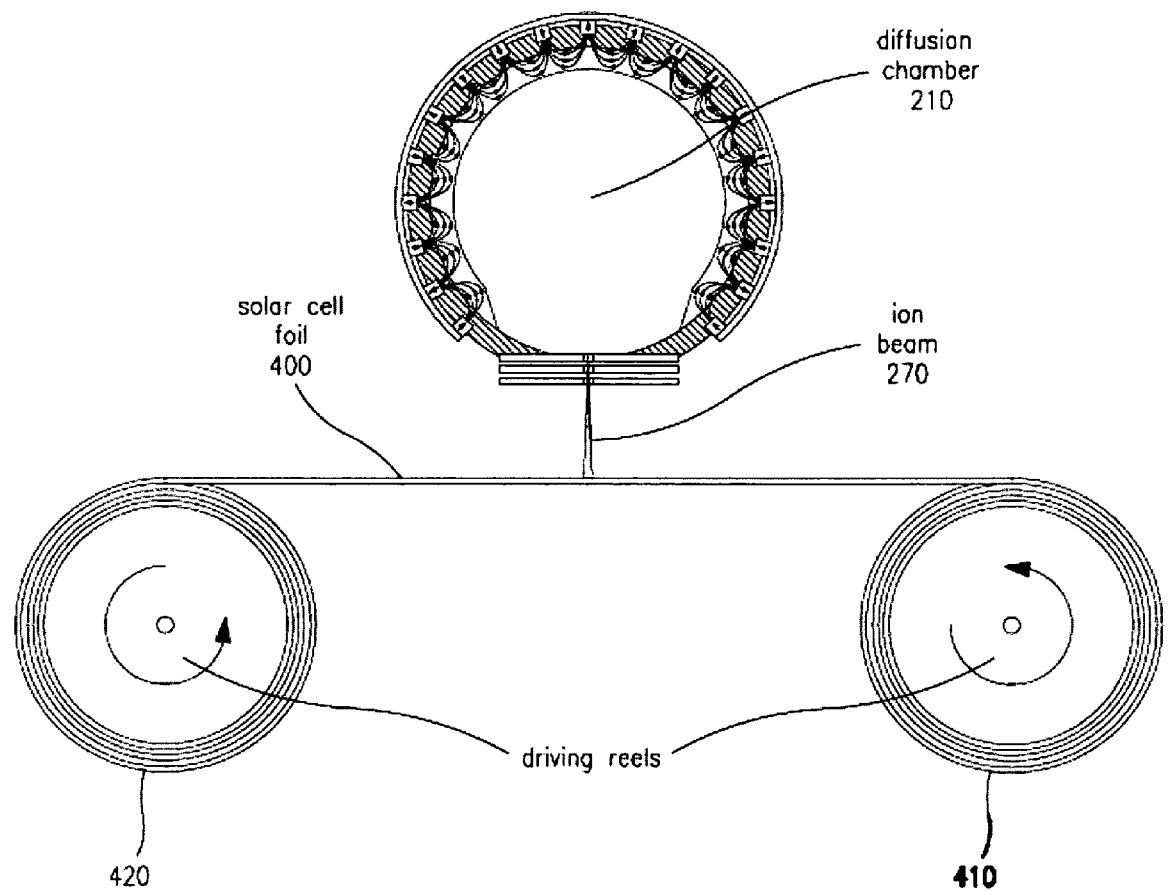
FIG. 10 shows an ion source configuration used for doping solar cell foils.

In a similar fashion, the solar cell foils 400, as shown in FIG. 10, can be doped. With the previously described ion beam source, the foil 400, which is wrapped onto two motor driven reels 410, 420, can be continuously passed through a vacuum chamber where it crosses the beam path. The high beam current will allow the desired doping to be realized quickly, preferably in a single pass, the dose being set by the beam current and the reel rotational speed. FIG. 10 shows a simple representation of this process. A cross-section of the chamber housing and diffusion chamber is shown, where an ion beam 270 is emitted. Other components of the ion source have been intentionally omitted from the Figure for clarity, but are present in this configuration. This ion beam is ribbon shaped, with the long dimension orthogonal to the plane of FIG. 10. In one embodiment, the solar cell foil is of a width equal to or slightly less than the width of the emitted ribbon ion beam. The ion beam strikes a portion of a solar cell foil 400, as it passes beneath the extraction aperture of the diffusion chamber 210. In one embodiment, the solar cell foil 400 is conveyed via rotating reels 410, 420. The speed of these reels can be adjusted to vary the amount of time each portion of the foil 400 is exposed to the ion beam.

What is claimed is:

1. An ion source comprising:
   a first inductively coupled plasma (ICP) source, comprising:
      a first dielectric cylinder having a first central axis, a first closed end and a first open end;
      a first gas inlet in communication with said first cylinder adapted to provide a first gas into said first cylinder; and
      a first antenna surrounding said first dielectric cylinder adapted to inductively couple RF power to said first gas;
   a second ICP plasma source, comprising:
      a second dielectric cylinder having a second central axis, a second closed end and a second open end;
      a second gas inlet in communication with said second cylinder adapted to provide a second gas into said second cylinder; and
      a second antenna surrounding said second dielectric cylinder adapted to inductively couple RF power to said second gas; and
   a chamber housing, defining a diffusion chamber, comprising first and second ends, wherein said first end of said diffusion chamber in communication with said open end of said first dielectric cylinder, said second end of said diffusion chamber in communication with said open end of said second dielectric cylinder and an extraction aperture having one dimension much larger than a second dimension, wherein said longer dimension is parallel to said first central axis of said first dielectric cylinder.

2. The ion source of claim 1, wherein said second central axis is parallel to said longer dimension of said extraction aperture and is coaxial with said first central axis of said first dielectric cylinder.

3. The ion source of claim 2, further comprising additional magnets surrounding said chamber housing to create a multicusp magnetic field.

4. The ion source of claim 2, further comprising a first RF power supply in communication with said first antenna and a second RF power supply in communication with said second antenna, each adapted to power said corresponding antenna.

5. The ion source of claim 4, wherein said RF power is provided to said first and second antenna through two independent matching networks.

6. The ion source of claim 2, further comprising extraction optics located near said extraction aperture, adapted to facilitate the exit of ions from said diffusion chamber.

7. An ion source comprising:
   a first electron cyclotron resonance (ECR) plasma source, comprising:
      a first cylinder having a first central axis,
      a first closed end and a first open end;
      a first gas inlet in communication with said first cylinder adapted to provide a first gas into said first cylinder;
      a first magnet surrounding said cylinder adapted to generate an axial magnetic field within said first cylinder; and
      a first dielectric window proximate to said closed end for introducing microwaves into said first dielectric cylinder, said microwaves and said magnetic field combining to ionize said first gas;
   a second ECR plasma source, comprising:
      a second cylinder having a second central axis, a second closed end and a second open end;
      a second gas inlet in communication with said second cylinder adapted to provide a second gas into said second cylinder;
      a second magnet surrounding said second cylinder adapted to generate an axial magnetic field within said second cylinder; and
      a second dielectric window proximate to said second closed end for introducing microwaves into said second cylinder, said microwaves and said magnetic field combining to ionize said second gas; and
   a chamber housing, defining a diffusion chamber, comprising first and second ends, wherein said first end of said diffusion chamber in communication with said open end of said first cylinder, said second end of said diffusion chamber in communication with said open end of said second cylinder and an extraction aperture having one dimension much larger than a second dimension, wherein said longer dimension is parallel to said first central axis of said first cylinder.

8. The ion source of claim 7, further comprising additional magnets surrounding said chamber housing to create a multicusp magnetic field.

9. The ion source of claim 7, wherein said first and second magnets comprise solenoids, and said ion source further comprises a DC current supply to control the magnetic fields created by said solenoids.

10. The ion source of claim 7, wherein said first and second magnets comprise solenoids, and said ion source further comprises a first and second DC current supply, wherein each of said solenoids is controlled by a corresponding current supply.

11. The ion source of claim 7, wherein said first and second magnets comprise permanent magnets.

12. The ion source of claim 7, further comprising extraction optics located near said extraction aperture, adapted to facilitate the exit of ions from said diffusion chamber.

13. A method of adjusting ion beam uniformity, comprising:
providing an ion source comprising:
a first plasma source, selected from the group consisting of ICP and ECR plasma sources, comprising:
a first cylinder having a first central axis, a first closed end and a first open end;
a first gas inlet in communication with said first cylinder adapted to provide a first gas into said first cylinder; and
a first means of ionizing said first gas into a plasma;
a second plasma source, selected from the group consisting of ICP and ECR plasma sources, comprising:
a second cylinder having a second central axis, a second closed end and a second open end;
a second gas inlet in communication with said second cylinder adapted to provide a second gas into said second cylinder; and
a second means of ionizing said second gas into a plasma; and
a chamber housing, defining a diffusion chamber, comprising first and second ends, wherein said first end of said diffusion chamber in communication with said open end of said first cylinder, said second end of said diffusion chamber in communication with said open end of said second cylinder and an extraction aperture having one dimension larger than a second dimension, wherein said longer dimension is parallel to said central axis of said first dielectric cylinder;
adjusting a characteristic of said ion source, said characteristics selected from the group consisting of a parameter associated with said means of ionizing said first and second gas, and the flow rates of said first and second gas into said inlets.

14. The method of claim 13, wherein said plasma sources comprise ICP plasma sources, and wherein said first and second means of ionizing said gas comprise:
surrounding said first cylinder with a first antenna in communication with a first RF power supply;
surrounding said second cylinder with a second antenna in communication with a second RF power supply; and
energizing said RF power supplies, thereby powering each of said antenna, and said parameter associated with said means of ionizing said first and second gas comprises adjusting the output of said RF power supplies.

15. The method of claim 13, wherein said plasma sources comprise ECR plasma sources and wherein said first and second means of ionizing said gas comprise:
surrounding said first cylinder with a first solenoid;
surrounding said second cylinder with a second solenoid;
introducing electromagnetic waves into said first and second cylinders, and
energizing a DC current supply to control the magnetic field profiles created by said solenoids,
wherein said parameter associated with said means of ionizing said first and second gas comprises adjusting the electrical current in said solenoids.

16. The method of claim 13, wherein said plasma sources comprise ECR plasma sources and wherein said first and second means of ionizing said gas comprise:
surrounding said first cylinder with a first permanent magnet;
surrounding said second cylinder with a second permanent magnet;
introducing electromagnetic waves into said first and second cylinders, and
wherein said parameter associated with said means of ionizing said first and second gas comprises adjusting the axial position of said permanent magnets.

17. The method of claim 13, wherein said plasma sources comprise ECR plasma sources and wherein said first and second means of ionizing said gas comprise:
injecting microwaves into said first cylinder through a first dielectric window on said first closed end,
injecting microwaves into said second cylinder through a second dielectric window on said second closed end, and
wherein said parameter associated with said means of ionizing said first and second gas comprises adjusting the power of said microwaves injected into said first and second cylinders.

* * * * *